US010985767B2

(12) United States Patent
Chen et al.

(10) Patent No.: US 10,985,767 B2
(45) Date of Patent: Apr. 20, 2021

(54) PHASE-LOCKED LOOP CIRCUITRY HAVING LOW VARIATION TRANSCONDUCTANCE DESIGN

(71) Applicant: ams AG, Premstaetten (AT)

(72) Inventors: Jia Sheng Chen, Premstaetten (AT); Gregor Schatzberger, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/760,326

(22) PCT Filed: Nov. 13, 2018

(86) PCT No.: PCT/EP2018/081040
§ 371 (c)(1),
(2) Date: Apr. 29, 2020

(87) PCT Pub. No.: WO2019/096772
PCT Pub. Date: May 23, 2019

(65) Prior Publication Data
US 2020/0343897 A1    Oct. 29, 2020

(30) Foreign Application Priority Data

Nov. 15, 2017   (EP) .................................... 17201928

(51) Int. Cl.
*H03L 7/099* (2006.01)
*H03L 7/089* (2006.01)

(52) U.S. Cl.
CPC .......... *H03L 7/0995* (2013.01); *H03L 7/0891* (2013.01)

(58) Field of Classification Search
None
See application file for complete search history.

(56) References Cited

U.S. PATENT DOCUMENTS 5,905,412 A * 5/1999 Rasmussen ............ H03K 3/011
327/288
5,936,441 A    8/1999 Kurita
5,942,949 A    8/1999 Wilson et al.
(Continued)

OTHER PUBLICATIONS

European Patent Office, International Search Report for PCT/EP2018/081040 dated Jan. 17, 2019.
(Continued)

*Primary Examiner* — Jeffery S Zweizig
(74) *Attorney, Agent, or Firm* — Mh2 Technology Law Group LLP

(57) ABSTRACT

A phase-locked loop circuitry (200) having low variation transconductance design comprises a voltage controlled oscillator structure (308) to provide an output signal (Fosc) having an oscillation frequency. The voltage controlled oscillator structure (308) comprises a voltage-to-current converter circuit (312) and a current controlled oscillator circuit (314). The voltage-to-current converter circuit is designed with a low variation transconductance. The voltage-controlled oscillator circuit (200) has a characteristic curve being independent of different PVT (processes, supply voltages and temperature) conditions to ensure that the phase-locked loop circuitry (200) is stable under different PVT condition.

14 Claims, 10 Drawing Sheets

(56) References Cited

U.S. PATENT DOCUMENTS

| | | | |
|---|---|---|---|
| 6,011,443 A * | 1/2000 | Chen | H03K 3/03 |
| | | | 331/175 |
| 6,211,743 B1 * | 4/2001 | Rhee | H03L 7/0891 |
| | | | 331/17 |
| 6,407,623 B1 | 6/2002 | Bazarjani et al. | |
| 6,552,618 B2 | 4/2003 | Nelson et al. | |
| 6,859,073 B1 | 2/2005 | Dai et al. | |
| 6,952,124 B2 * | 10/2005 | Pham | H03L 7/099 |
| | | | 327/148 |
| 6,985,040 B2 * | 1/2006 | Kim | H03K 3/011 |
| | | | 331/116 FE |
| 6,993,106 B1 * | 1/2006 | Momtaz | H03L 7/107 |
| | | | 375/354 |
| 7,106,107 B2 * | 9/2006 | Bhattacharya | H03K 3/02337 |
| | | | 327/206 |
| 7,298,182 B2 * | 11/2007 | Kim | G11C 11/406 |
| | | | 327/65 |
| 7,474,130 B1 | 1/2009 | Lo et al. | |
| 7,808,326 B2 * | 10/2010 | Sogawa | H03L 7/18 |
| | | | 331/16 |
| 8,988,154 B2 * | 3/2015 | Zhang | H03L 7/00 |
| | | | 331/57 |
| 10,411,721 B2 * | 9/2019 | Oki | G05F 1/59 |

OTHER PUBLICATIONS

Sheikholeslami A.: "Source degeneration (Circuit intuitions)" IEEE Solid-state circuits magazine, IEEE, USA, vol. 6, No. 3, Jul. 1, 2014, pp. 5-6.

European Examination Report in corresponding European Application No. 17201928.3 dated Nov. 27, 2020, 9 pages.

* cited by examiner

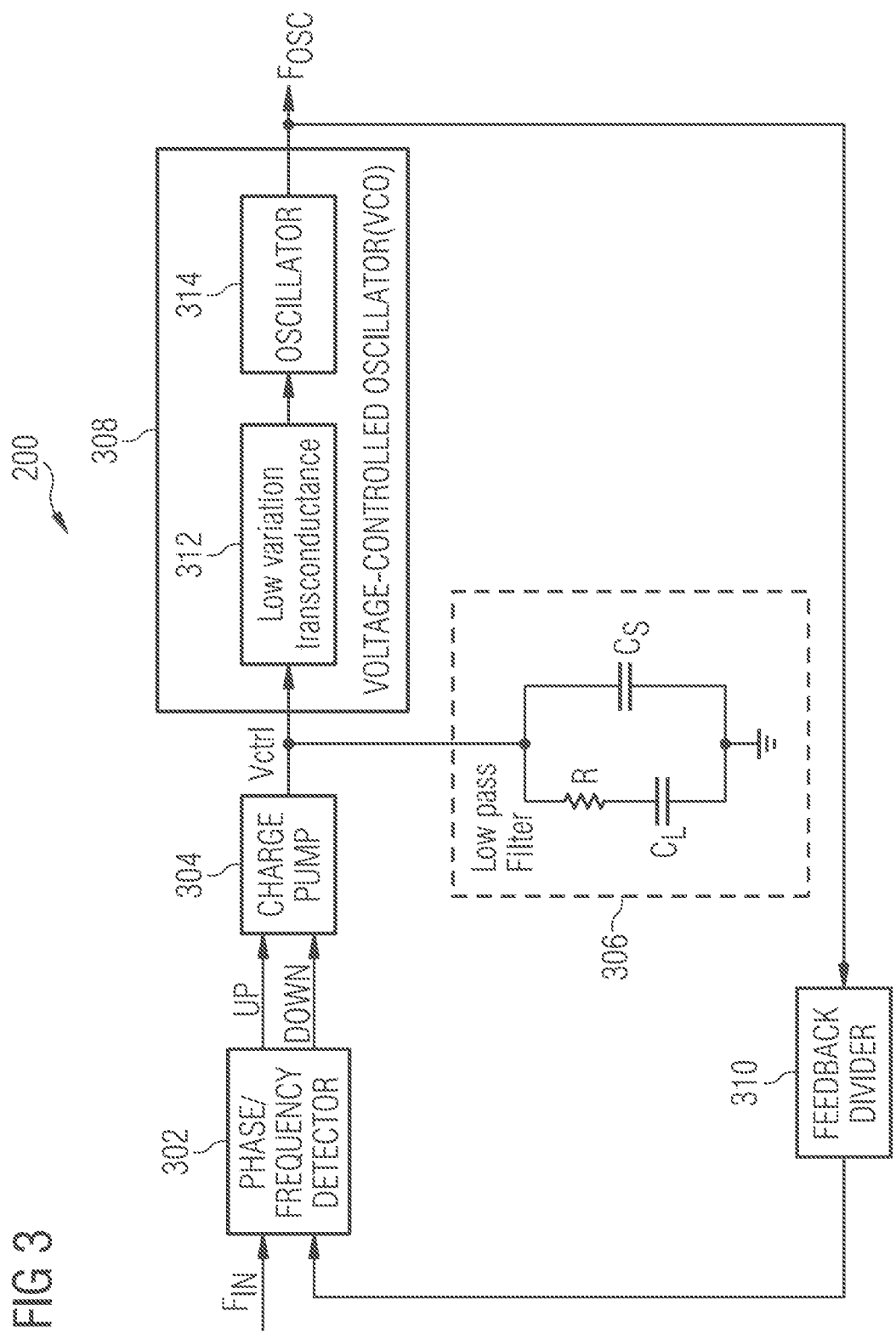

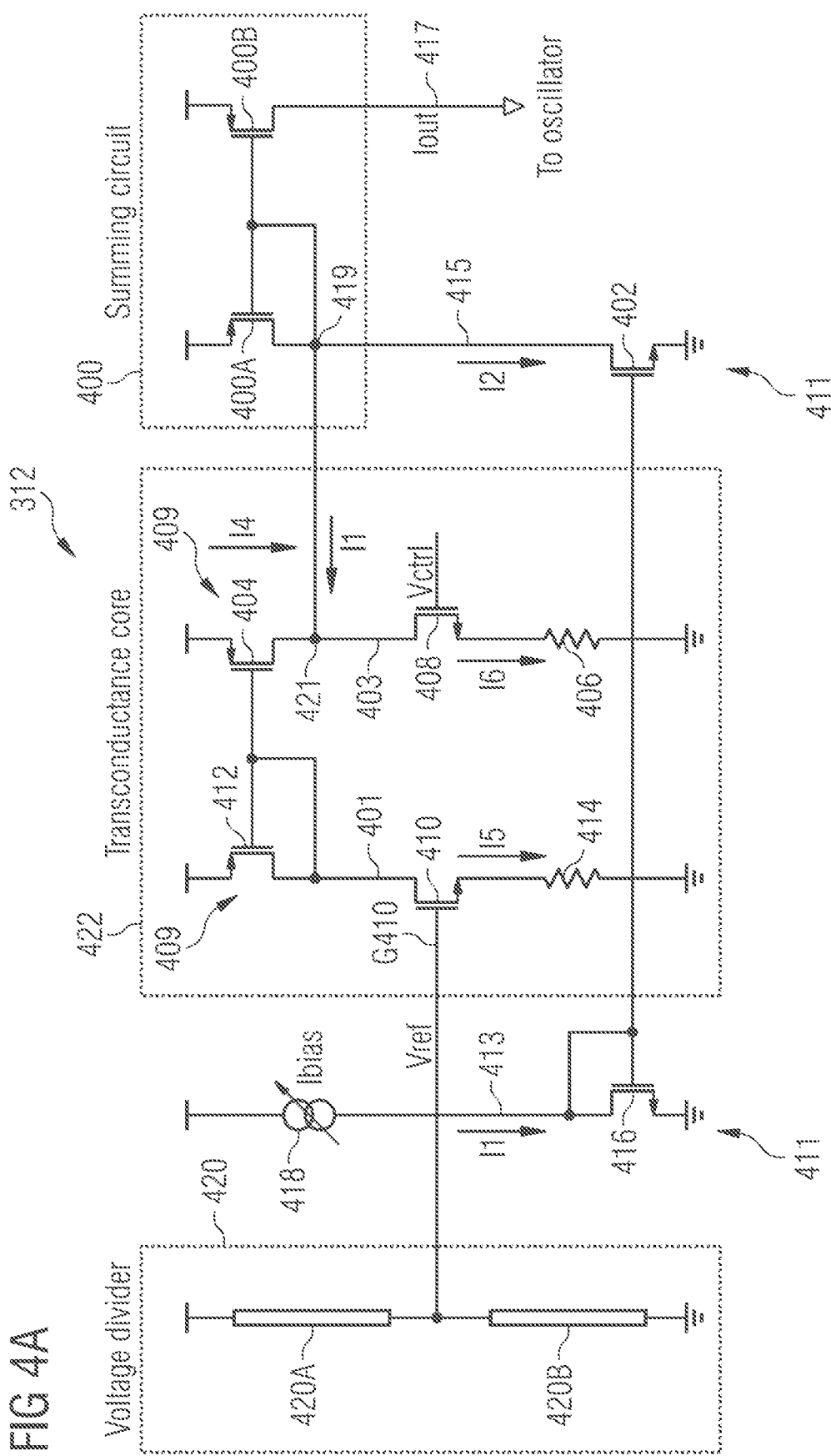

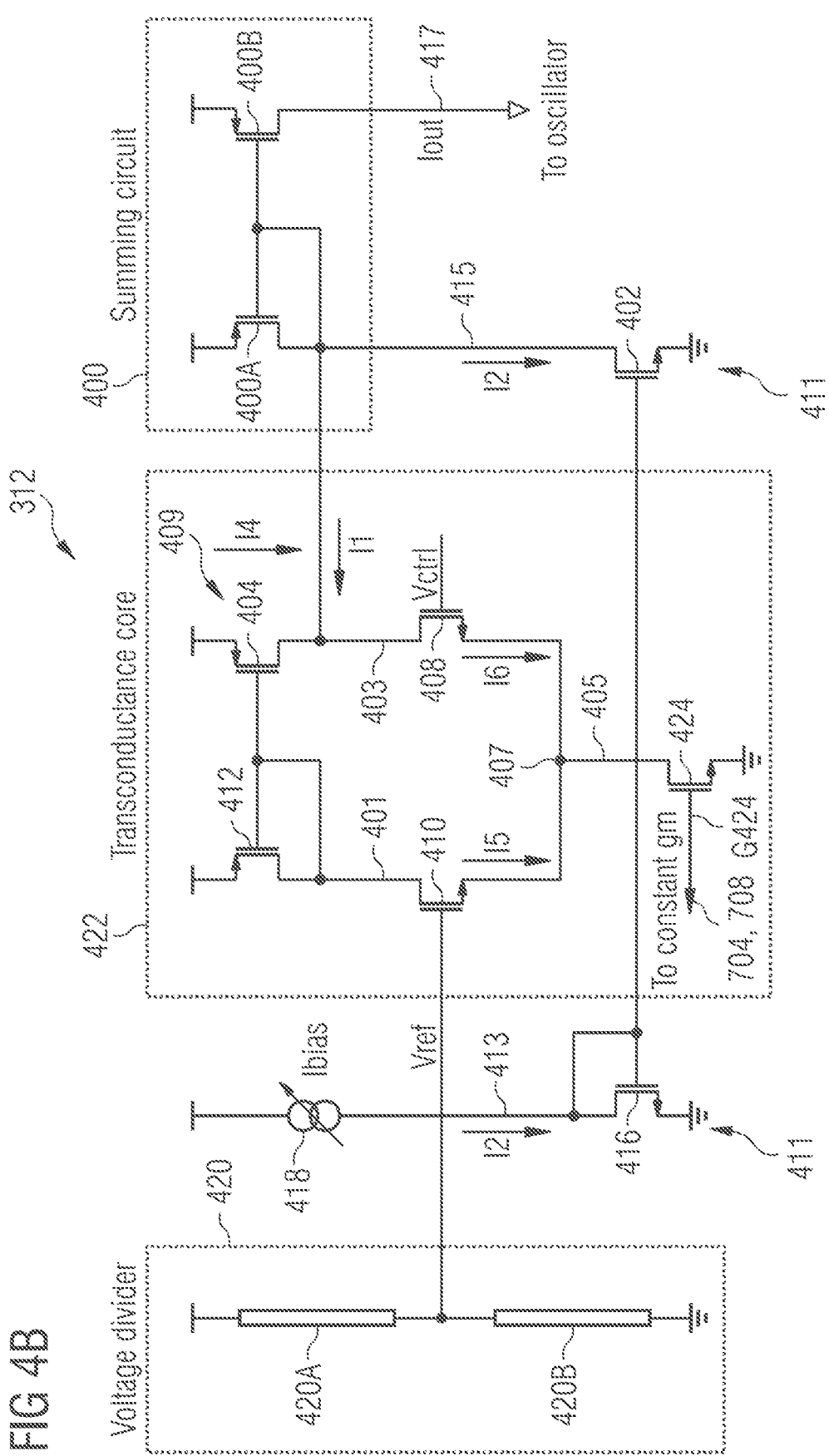

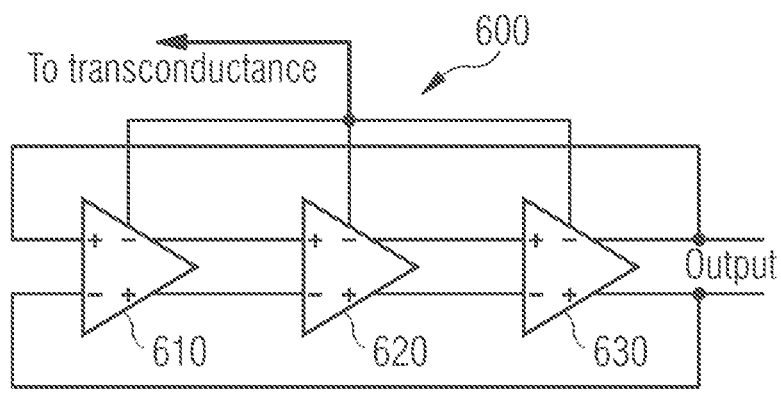

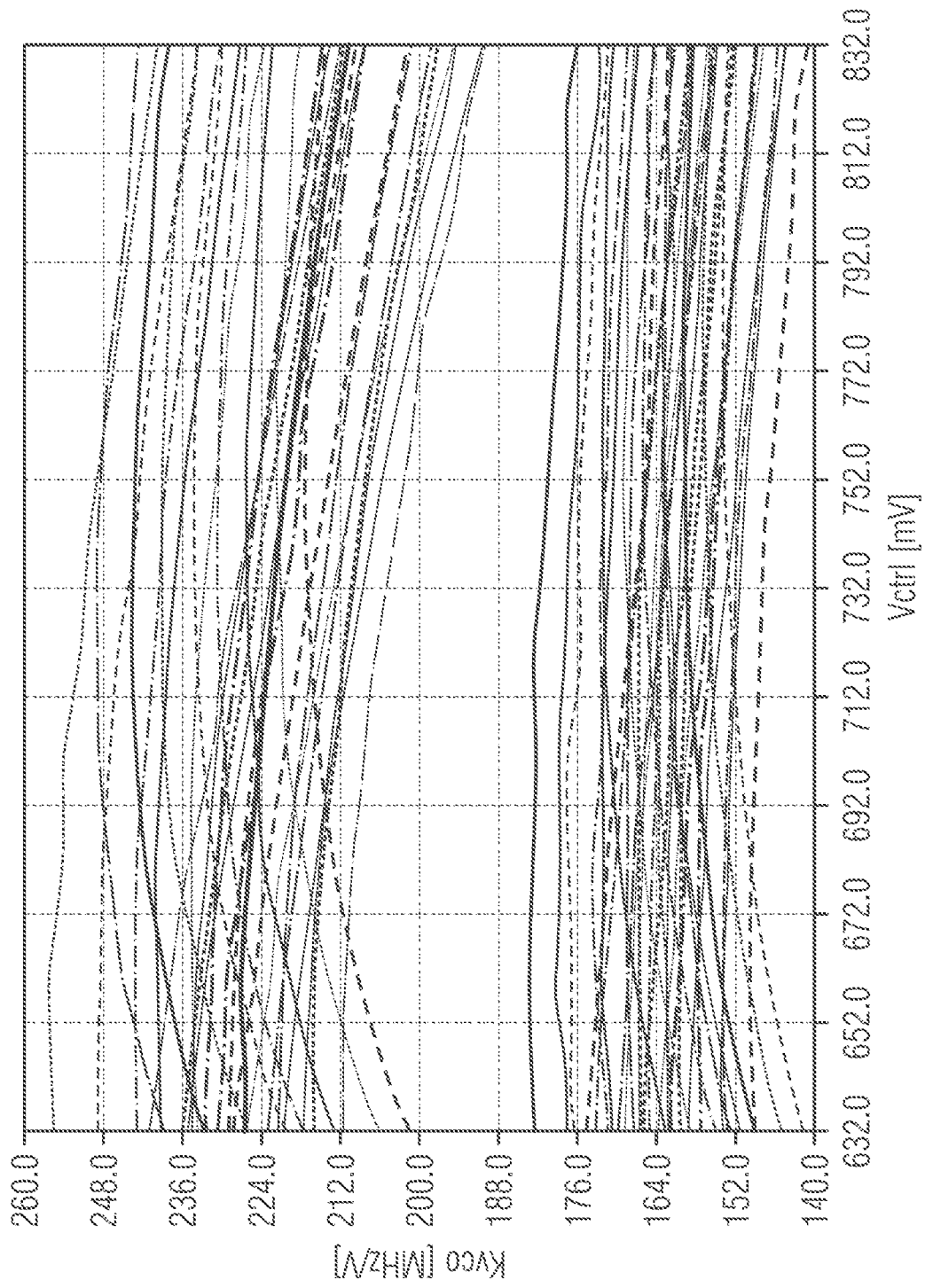

PHASE-LOCKED LOOP CIRCUITRY HAVING LOW VARIATION TRANSCONDUCTANCE DESIGN

TECHNICAL FIELD

The disclosure relates to a phase-locked loop circuitry having a low variation transconductance design to limit a gain variation of a voltage-controlled oscillator structure of the phase-locked loop circuitry.

BACKGROUND

A phase-locked loop circuitry comprises a phase/frequency detector which compares an input/reference signal and a feedback signal of a feedback path of the phase-locked loop circuity. The phase detector outputs an error signal which is proportional to the phase difference of the input/reference signal of the phase/frequency detector and the feedback signal. A charge pump generates amounts of charge corresponding to the error signals. A loop filter accumulates the amounts of charge to generate a loop-filter voltage.

The loop-filter voltage is a control signal/control voltage that is applied to an input terminal of a voltage-controlled oscillator. The voltage-controlled oscillator, which is driven by the control signal/control voltage, creates an output signal having an oscillation frequency and a phase, wherein the phase deviation between the input/reference signal and the output signal of the voltage-controlled oscillator circuit is nearly constant. The output signal is fed back through an optional divider circuit to the input side of the phase/frequency detector.

The characteristic curve of the voltage-controlled oscillator circuit plays a key role when it comes to the stability of the phase-locked loop circuitry. Its designed frequency and the gain (Kvco) are two major factors which affect the stability of the phase-locked loop circuitry. Under different processes, supply voltages and temperature (PVT), the characteristic curve of the voltage-controlled oscillator changes a lot.

There is a desire to provide a phase-locked loop circuitry comprising a voltage-controlled oscillator structure whose characteristic curve is almost independent of different PVT (processes, supply voltages, temperature) condition.

SUMMARY

An embodiment of a phase-locked loop circuitry being stable as far as possible under different PVT conditions is specified in claim 1.

According to a possible embodiment, the phase-locked loop circuitry comprises a voltage controlled oscillator structure to provide an output signal having an oscillation frequency. The voltage controlled oscillator structure comprises a voltage-to-current converter circuit and a current controlled oscillator circuit. The voltage-to-current converter circuit generates a control current to control the current controlled oscillator circuit so that the current controlled oscillator structure generates the output signal with the oscillation frequency, the oscillation frequency being dependent from the control current Iout.

The voltage-to-current converter circuit includes a voltage-to-current converter core having a first current branch and a second current branch. The first current branch comprises a first transistor, and the second current branch comprises a second transistor. The voltage-to-current converter core includes a current mirror loading unit to mirror a current of the first current branch in the second current branch. The first transistor has a gate terminal to apply a reference voltage.

The principle of the phase-locked loop circuitry is designing a voltage-to-current converter circuit having a low variation transconductance, which can limit the gain variation of the voltage-controlled oscillator structure, and at the same time the design challenges of a charge pump of the phase-locked loop circuitry will not be increased. Through this solution, the phase-locked loop (PLL) stability can be increased in different PVT conditions and ease the loop filter design specification of the phase-locked loop circuity.

The phase-locked loop circuitry is configured as a charge pump phase-locked loop with a voltage-controlled oscillator structure designed with a voltage-to-current converter having a low variation transconductance. Biased by a trimmed current source, which is not just for the PLL but for the whole chip in which the phase-locked loop circuitry is integrated, the voltage-to-current converter having the low variation transconductance is designed with a source degeneration resistor for the purpose of achieving low PVT variation.

A reference voltage which may be generated from the chip itself provides a reference voltage to bias the first transistor of the voltage-to-current converter core which generates another bias current. A reference voltage generator to generate the reference voltage is able to be realized with high density resistor or transistor without taking up too large layout area. The phase-locked loop circuitry comprises a summing circuit including a summing current mirror. The summing current mirror sums up currents and mirrors the summing current/output current to an oscillator. The oscillator is configured as a current-controlled oscillator circuit. Since the trimmed current is for the whole chip, not just for the PLL, an efficient trimming plane is performed.

With the voltage-to-current converter having a low variation transconductance design, the VCO gain (Kvco) PVT variation is less than ±30%, which is 40% less than just using a simple common source transistor. This provides lots of advantages, such as that no further VCO gain trimming circuit is needed. Furthermore, the PLL low pass filter size can be reduced and be less sensitive to parasitic effects. These advantages not only reduce large amounts of PLL-layered area but also enhance the stability of the PLL. Additional testing time can also be skipped. Furthermore, the source degeneration resistor can be designed to be a trimmable resistor and further reducing the VCO gain (Kvco) variation.

Additional features and advantages are set forth in the detailed description that follows, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

BRIEF DESCRIPTION OF THE DRAWINGS

FIG. 3 shows an embodiment of a phase-locked loop circuitry having low variation transconductance design.

FIG. 4A shows a first embodiment of a voltage-to-current converter circuit having a low variation transconductance to provide a control current as input signal for a current-controlled oscillator circuit.

FIG. 4B shows a second embodiment of a voltage-to-current converter circuit having a low variation transconductance to provide a control current as input signal for a current-controlled oscillator circuit.

FIG. 6 shows a possible embodiment of a current-controlled oscillator.

FIGS. 8A and 8B show respective characteristic curves of a voltage-controlled oscillator structure during normal operation of a phase-locked loop circuitry.

DETAILED DESCRIPTION

Figure 1:
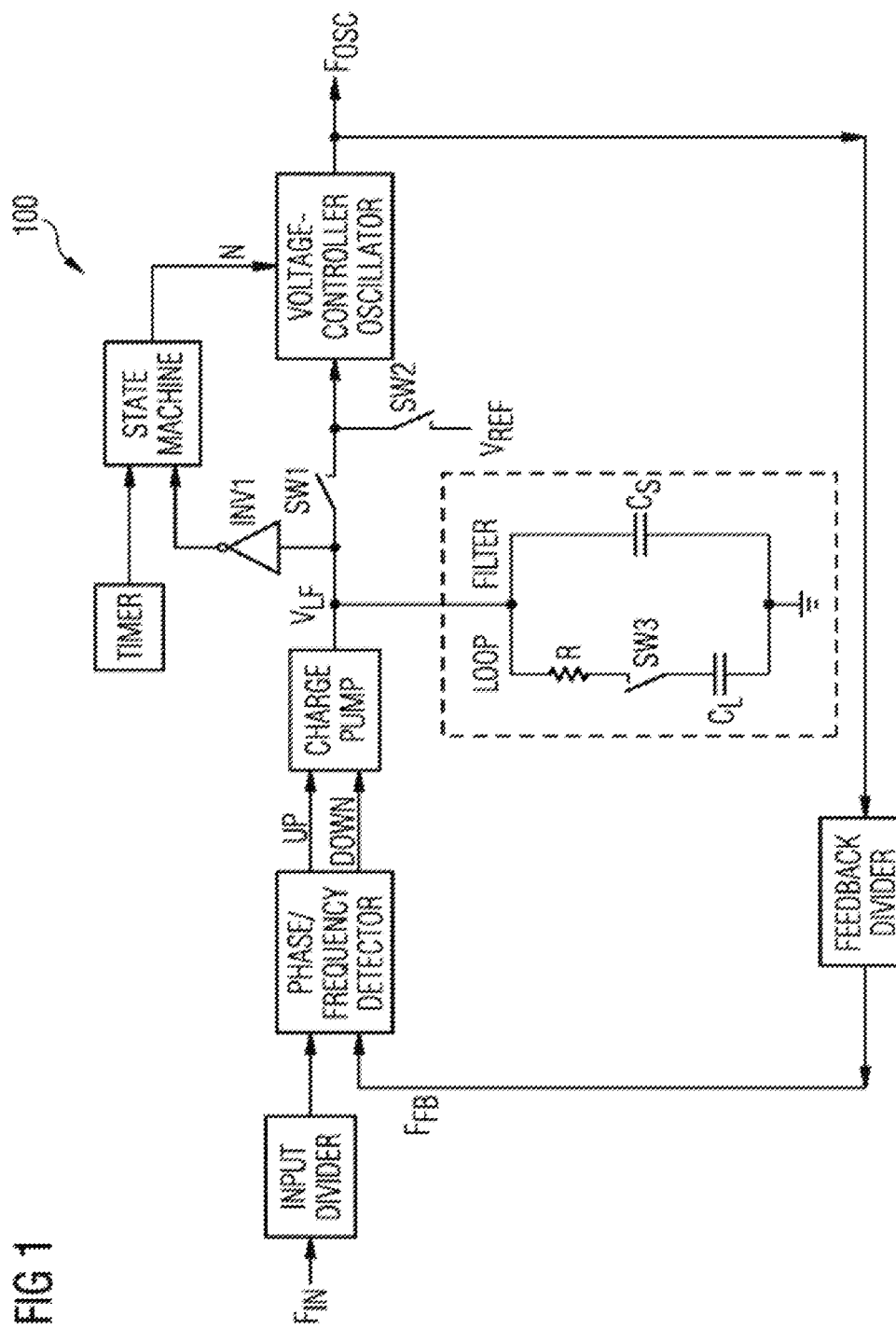
FIG. 1 shows a block diagram of a prior art trimmable phase-locked loop circuitry design.

Embodiments of a phase-locked loop circuitry having low variation transconductance design and its components are now be described more fully hereinafter with reference to the accompanying drawings. The embodiments of the phase-locked loop circuitry and its components may, however, be embodied in many different forms and should not be construed as limited to the embodiments set forth herein; rather, these embodiments are provided so that the disclosure will fully convey the scope of the embodiments of the phase-locked loop circuitry and its components to those skilled in the art. The drawing are configured to clearly illustrate the different embodiments of the phase-locked loop circuitry and its components.

Figure 2:
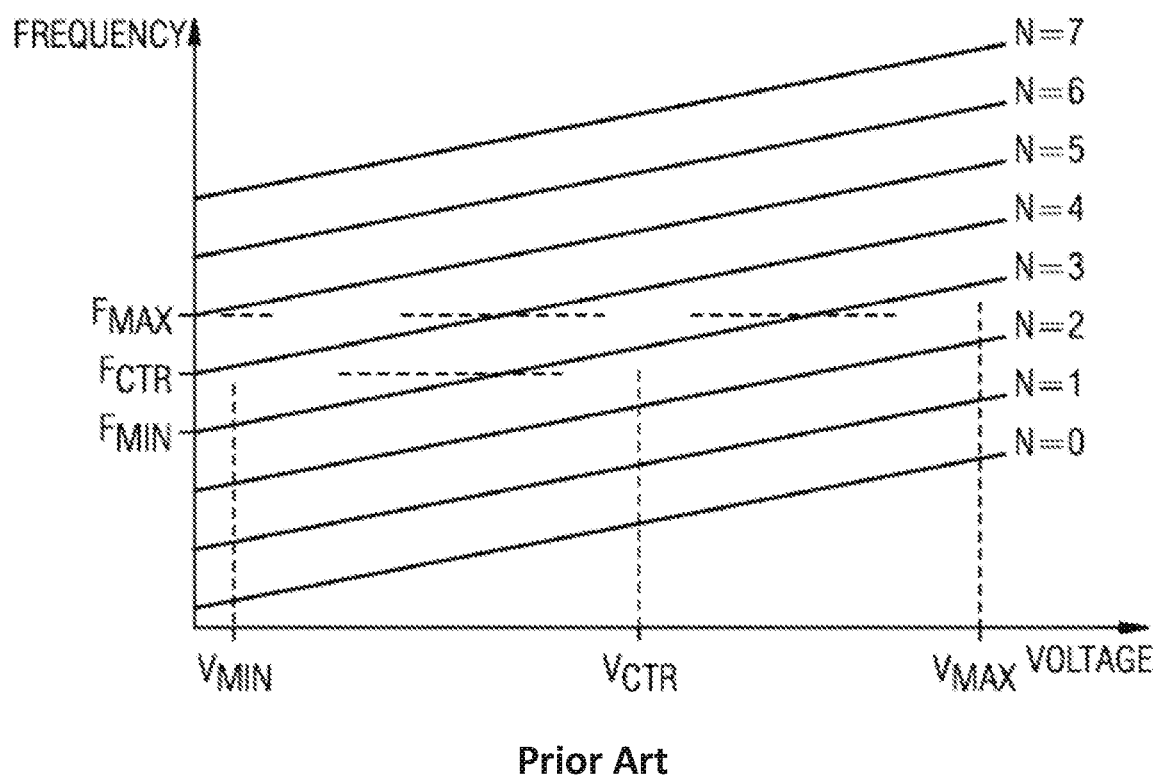
FIG. 2 shows a characteristic curve of a voltage-controlled oscillator of the trimmable phase-locked loop circuitry of FIG. 1.

FIG. 1 shows an embodiment of a trimmable prior art phase-locked loop circuitry (PLL) as described by U.S. Pat. No. 5,942,949 A. The PLL 100 uses a state machine, a timer and an inverter. The basic idea of this implementation is that an oscillator having a plurality of operating curves, as shown in FIG. 2, is designed for the PLL. During PLL auto-trim operations, the oscillator is automatically trimmed to an appropriate oscillator operating curve for use during normal PLL operations. In particular embodiments, the PLL is a charge-pump PLL having a phase/frequency detector (PFD) that generates error signals based on comparing an input signal and a PLL feedback signal.

The phase-locked loop circuitry 100 comprises a charge-pump that generates amounts of charge corresponding to the error signals. The loop circuitry further comprises a loop filter that accumulates the amounts of charge to generate a loop-filter voltage $V_{LF}$. The loop-filter voltage $V_{LF}$ is used as an input signal for a voltage-controlled oscillator (VCO), where the output signal of the voltage-controlled oscillator is used to generate the PLL feedback signal.

During normal PLL operations, the loop-filter voltage is applied to the voltage input terminal of the voltage-controlled oscillator. During the PLL auto-trim operations, controllable switches SW1 and SW3 are open and a controllable switch SW2 is closed. The state machine applies a sequence of digital control input values to the voltage-controlled oscillator to select different VCO operating curves, as shown in FIG. 2, until an appropriate operating curve for the present PLL application is found. In different embodiments, the state machine uses different signals to determine whether a center frequency $F_{CTR}$ of each operating curve N=0, . . . N=7 in the sequence, as shown in FIG. 2, is above or below the desired nominal operating frequency for the voltage-controlled oscillator, and selects one such operating curve for use in normal operations.

Since the voltage-controlled oscillator is not permanently trimmed, the phase-locked loop circuitry 100 can be used and then re-used for different applications operating at different nominal frequencies. Each time the phase-locked loop circuitry 100 is powered up, the voltage-controlled oscillator will be trimmed to the current appropriate trim setting. In addition, the PLL auto-trim operations may be repeated whenever an appropriate reset signal is applied to the PLL.

A drawback of the solution illustrated in FIGS. 1 and 2 is the center frequency of the voltage-controlled oscillator should be calibrated first before the phase-locked loop circuitry 100 is in normal operation, which will need additional time for calibration. Besides, the gain (Kvco) of the voltage-controlled oscillator is not able to be calibrated. A certain variation range of the gain (Kvco) of the voltage-controlled oscillator exists in the PLL. Variation may reduce the strength of the circuit for staying dynamically stable. This increases the burden of the low pass filter design and increases the PLL layout area.

FIG. 3 shows a block diagram of an embodiment of a charge-pump phase-locked loop circuitry (PLL) 200. An input signal $F_{IN}$ and a feedback signal of a feedback path of the PLL are applied to an input side of a phase/frequency detector 302. The phase/frequency detector 302 generates error signals UP and DOWN at its output side based on a comparison of the input signal $F_{IN}$ and the feedback signal. The error signals are applied to a charge-pump 304. The charge-pump 304 is coupled to an input side 1308 of a voltage-controlled oscillator structure 308.

The phase-locked loop circuitry 200 further comprises a low pass filter 306 which is also coupled to the input side 1308 of the voltage-controlled oscillator structure 308. The low pass filter 306 operates as an integrator that accumulates the net charge from the charge-pump 304. According to the embodiment in FIG. 3, the low pass filter 306 may have a relatively simple design comprising a capacitor Cs in parallel with a series combination of a resistor R and a relatively large capacitor Cl forming a second order filter. Other more sophisticated loop filters are also possible.

A control signal Vctrl generated by the low pass filter 306 is applied to the input side 1308 of the voltage-controlled oscillator structure 308. The voltage-controlled oscillator structure 308 is configured to provide an output signal Fosc having an oscillation frequency. The output signal Fosc is fed back to the input side of the phase/frequency detector 302 through a feedback divider 310.

The voltage-controlled oscillator structure 308 comprises a voltage-to-current converter circuit 312 and a current-controlled oscillator circuit 314. The voltage-to-current converter circuit 312 generates a control current Iout to control the current-controlled oscillator circuit 314 so that the current-controlled oscillator structure 308 generates the output signal Fosc with the oscillation frequency, the oscillation frequency being dependent from the control current Iout.

FIGS. 4A and 4B show different embodiments of a voltage-to-current converter circuit 312 to provide the control current Iout for controlling the current-controlled oscillator circuit 314. The voltage-to-current converter circuit 312 having low variation transconductance is realized by a voltage divider 420, a bias circuitry 418, 416, 402, a current summing circuit 400 and a voltage-to-current converter core/transconductance core 422.

According to the embodiment of the voltage-to-current converter circuit 312 shown in FIG. 4A, the voltage-to-current converter circuit 312 includes a voltage-to-current converter core 422 having a first current branch 401 and a second current branch 403. The first current branch 401 comprises a first transistor 410, and the second current branch 403 comprises a second transistor 408. The voltage-to-current converter core 422 includes a current mirror loading unit 409 to mirror a current I5 of the first current branch 401 in the second current branch 403.

The voltage-controlled oscillator structure 308 has an input terminal 1308 to apply a control signal Vctrl to control the oscillation frequency of the output signal Fosc of the voltage-controlled oscillator structure 308. The input terminal 1308 of the voltage-controlled oscillator structure 308 is connected to a gate terminal G408 of the second transistor 408 of the second current branch 403 of the voltage-to-current converter core 422.

The current mirror loading unit 409 comprises a transistor 404 and a transistor 412. The transistor 412 is connected with its source terminal to a terminal to provide a supply voltage VDD and with its drain terminal to the first transistor 410. The transistor 404 is connected with its source terminal to the terminal to provide the supply voltage VDD and with its drain terminal to the transistor 408.

The voltage-to-current converter circuit 312 comprises a voltage generator circuit 420 to generate a reference voltage Vref. The voltage generator circuit 420 generates the reference voltage Vref in dependence from the supply voltage VDD. The first transistor 410 of the voltage-to-current converter core 422 has a gate terminal G410 to apply the reference voltage Vref. The voltage generator 420 is configured as a voltage divider comprising the components 420a and 420b that are coupled in series between a terminal to provide the supply voltage VDD and a terminal to provide a ground potential GND. The reference voltage Vref is tapped at an internal node of the voltage divider 420 between the components 420a and 420b. As shown in FIG. 4A, the components 420a and 420b can be realized by two resistors or other transistor level circuitry design. The voltage divider/generator 420 is responsible for providing the on-chip reference voltage Vref. In different applications, this reference voltage is usually designed at a certain ratio of the supply voltage VDD.

The first current branch 401 of the voltage-to-current converter core 422 comprises a first resistor 414 connected in series with the first transistor 410 between the terminal to provide the supply voltage VDD and the ground potential GND. The second current branch 403 comprises a second resistor 406 connected in series with the second transistor 408 between the terminal to provide the supply voltage VDD and the ground potential GND. The first resistor 414 is configured as a source degeneration resistor for the first transistor 410. The second resistor 406 is configured as a source degeneration resistor for the second transistor 408.

The voltage-to-current converter circuit 312 further comprises a bias circuitry 411 comprising a current branch 413 to provide a current I2 and a current branch 415. A transistor 402 is arranged in the current branch 415, and a transistor 416 is arranged in the current branch 413. The bias circuitry 411 comprises a current mirror comprising the transistors 416 and 402 to mirror a current I2 from the current branch 413 in the current branch 415. The bias circuitry is for providing DC bias current for the oscillator. A bias current Ibias is provided by a chip biasing circuitry illustrated in FIG. 4A as a trimmable current source 418 and is able to be trimmed to an accurate value. This bias current trimming is done before the PLL 200 is in its normal operation.

The voltage-to-current converter circuit 312 further comprises a summing circuit 400 to sum up a current I1 and the current I2 to generate the control current Iout in an output current branch 417. The summing circuit 400 comprises a transistor 400a and a transistor 400b. The transistors 400a and 400b are arranged in the summing circuit 400 to form a current mirror of the summing circuit 400. In particular, the transistor 400a is arranged between a terminal to provide a supply potential VDD and the current branch 415. The transistor 400b is arranged in the output current branch 417 to provide the output current Iout.

The summing circuit 400 has an internal node 419 being arranged between the transistor 400a and the transistor 402. The internal node 419 of the summing circuit 400 is connected to an internal node 421 of the voltage-to-current converter core 422, the internal node 421 being located between the transistor 408 and the transistor 404 to provide the current I1 from the internal node 419 of the summing circuit 400 to the internal node 421 of the voltage-to-current converter core 422.

FIG. 4B shows another embodiment of the voltage-to-current converter circuit 312 being of the same concept as the voltage-to-current converter circuit 312 of FIG. 4A, but which differs from the embodiment of the voltage-to-current converter circuit 312 of FIG. 4A in that the voltage-to-current converter core 422 comprises a current branch 405 including a current source 424 biased by a control circuit 704, 708. Embodiments of the control circuit 704, 708 are explained below with reference to FIGS. 7A and 7B. According to the embodiment of the voltage-to-current converter core 422 shown in FIG. 4B, the source degeneration resistors 414 and 406 of the voltage-to-current converter core 422 of FIG. 4A are replaced by the current source 424 biased by the control circuit 704, 708. The control circuit 704, 708 is configured as a constant transconductance circuitry.

According to the embodiment of the voltage-to-current converter core 422 illustrated in FIG. 4B, the first current branch 401 and the second current branch 403 are connected in parallel between a terminal to provide a supply potential VDD and a common node 407. The current branch 405 is connected in series to the parallel connection of the first and the second current branch 401, 403. The current source 424 may be configured as a transistor having a gate terminal G424. The gate terminal G424 is biased by a control signal generated by a constant transconductivity circuitry.

Figure 5A:
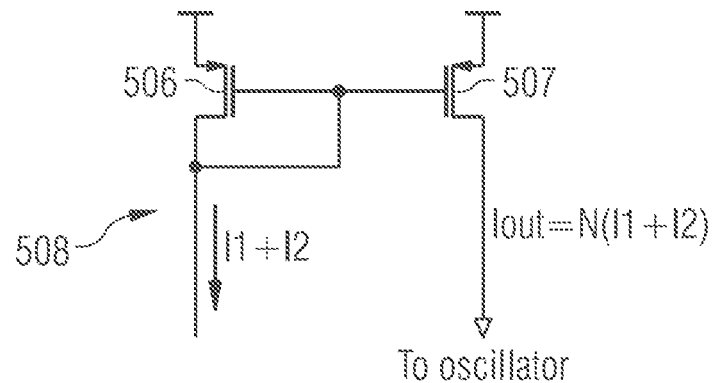
FIGS. 5A to 5C show possible embodiments for a current mirror loading unit and a summing circuit of the voltage-to-current converter circuit having low variation transconductance.
Figure 5B:
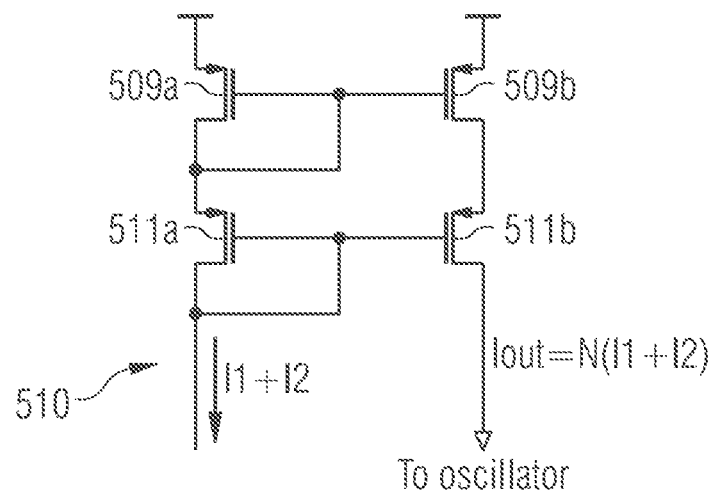
Figure 5C:
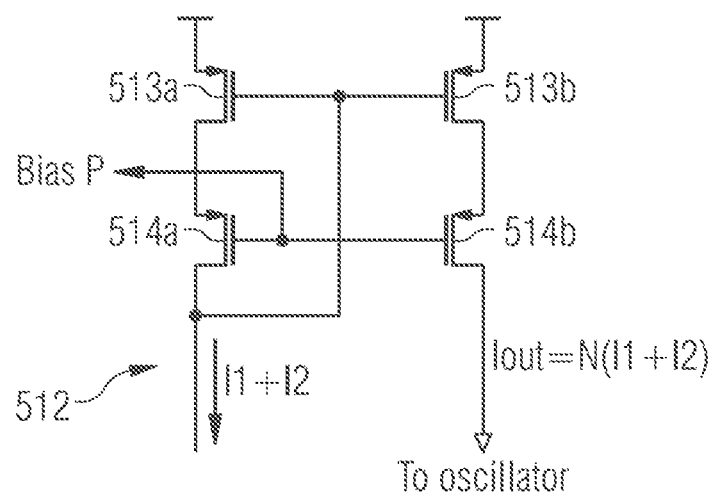

Regarding FIGS. 4A and 4B, the current mirror loading 409 and the summing circuit 400 can be designed as simple current mirror circuits, as illustrated in FIGS. 4A and 4B. FIGS. 5A, 5B and 5C show different embodiments to design the current mirror loading unit 409 and the summing circuit 400, for example cascaded current mirrors or more sophisticated current mirrors. According to the various embodiments of the current mirror loading unit 409 and the summing circuit 400, a summing current I1+I2 is mirrored from an input current branch to an output current branch to generate the output current Iout=N×(I1+I2).

FIG. 5A shows a simple current mirror 508 comprising the transistors 506 and 507. FIG. 5B shows a cascade current mirror 510 comprising the transistors 509a, 509b, and 511a, 511b. FIG. 5C shows an embodiment of a wide swing cascade current mirror 512 comprising the transistors 513a, 513b and 514a, 514b.

FIG. 6 shows a possible embodiment of the current-controlled oscillator circuit 314 being configured as a ring oscillator. The ring oscillator 600 comprises inverters 610, 620 and 630 coupled in series. The ring oscillator 600 is controlled by the control current Iout generated by the voltage-to-current converter circuit 312.

Figure 7A:
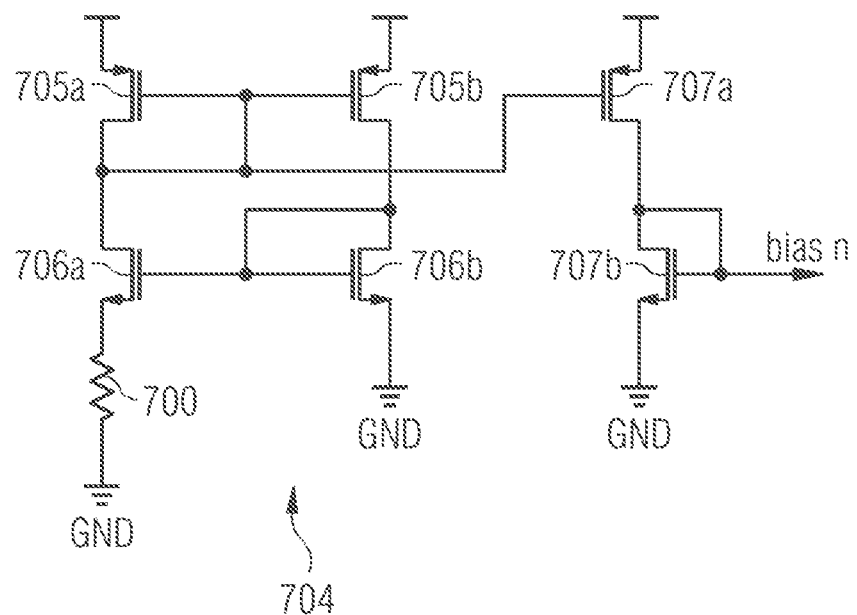
FIGS. 7A and 7B show possible embodiments of a control circuit of a voltage-to-current converter core having low variation transconductance with constant gm.
Figure 7B:
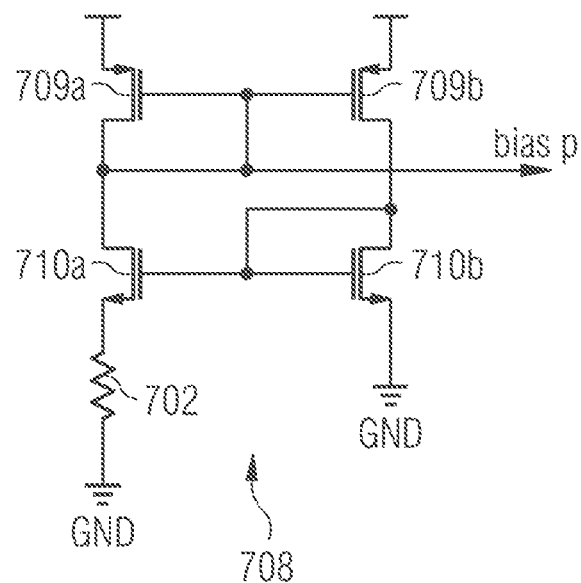

FIGS. 7A and 7B show possible embodiments for a control circuit being configured as a constant transconductivity circuit to apply a control signal bias n (FIG. 7A) or bias p (FIG. 7B) to the current source 424 of the voltage-to-current converter core 422 of FIG. 4B.

FIG. 7A shows an embodiment of a constant transconductivity circuitry 704 to provide the control signal bias n to the gate terminal G424 of the constant current source 424. The constant transconductivity circuitry comprises transistors 705a, 705b and 706a, 706b, and 707a, 707b, and a resistor 700. Referring to FIG. 7A, the transistors 705a, 706a and the resistor 700 are arranged in a first current path between a terminal to apply the supply voltage VDD and a ground potential GND. A second current path is also arranged between the terminal to apply the supply potential VDD and the ground potential, the second current path comprising the transistors 705b and 706b. The gate terminals of the transistor 705a and 705b are connected to each other. Furthermore, the gate terminals of the transistors 706a and 706b are also connected to each other.

The gate terminal of the transistor 705a is directly connected to the drain terminal of the transistor 705a. The gate terminal of the transistor 706b is directly connected to the drain terminal of the transistor 706b. The gate terminals of the transistor 705a, 705b and the drain terminal of the transistor 705a are connected to a gate terminal of the transistor 707a. The constant transconductivity circuitry 704 comprises a third current branch including the transistor 707a and 707b which are coupled in series between the supply voltage VDD and the ground potential GND. The gate terminal of the transistor 707b is connected to the drain terminal of the transistor 707b. The control signal bias n generated in the third current branch is applied to the gate terminal G424 of the transistor 424.

The constant transconductivity circuitry 708 shown in FIG. 7B comprises transistors 709a, 709b, transistors 710a, 710b and a resistor 702. Referring to FIG. 7B, the embodiment of the constant transconductivity circuitry 708 comprises a first current branch arranged between a terminal to apply a supply voltage VDD and a ground potential GND. The first current branch comprises a series connection of the transistors 709a and 710a as well as the resistor 702. A second current branch comprising a series connection of the transistors 709b and 710b is also arranged between the supply voltage VDD and the ground potential GND. The gate terminals of the transistors 710a and 710b are connected to each other, and the gate terminal of the transistor 710b is directly connected to the drain terminal of the transistor 710b. The gate terminals of transistors 709a and 709b are connected to each other, and the gate terminal of the transistor 709a and the drain terminal of the transistor 709a are connected to each other. The constant transconductivity circuitry 708 generates the control signal bias p which can be applied to the gate terminal G424 of the transistor/constant current source 424 of the voltage-to-current converter core 422 according to the embodiment shown in FIG. 4B.

Other types of constant transconductivity circuitry designs as shown in FIGS. 7A and 7B can also be implemented.

During the PLL normal operation, the PLL loop will regulate the control voltage Vctrl to achieve the designed PLL output frequency. In different PVT (process, supply voltage and temperature) conditions, the corresponding Vctrl level is obtained. Under each Vctrl level there will be a corresponding VCO gain (Kvco). Since the VCO output frequency is regulated by the loop, the designed frequency can be accurately achieved under different PVT conditions.

When the control voltage Vctrl has a voltage difference $\Delta V$, the corresponding frequency difference $\Delta f$ at the VCO output will appear. The relation is derived as following:

$$Kvco=\Delta f/\Delta V \text{ being proportional to } Gm=\Delta I/\Delta V$$

Based on the above derivation, the transconductance Gm is realized by the voltage-to-current converter core/transconductance core 422 as shown in FIG. 4A. Through transistor 408, the transconductance Gm is equal to 1/[R+(1/gm)]. R is the value of the components 406 and 414. The value gm is the transconductance of the transistor 408. When R is much larger than gm, the transconductance Gm is proportional to 1/R. This means that the PVT variation of Gm will be dominated by the PVT variation of the resistors 406 and 414, which is usually around ±20% to ±30%. The Kvco variation is then limited within this range.

The current mirror loading 409 is for mirroring the current I5 which is controlled by the reference voltage Vref from the current branch 401 to the current I6 in the current branch 403. The current I5 in the current branch 401 is dependent from the reference voltage Vref and thus from the supply voltage VDD. When the temperature, for example, gets high, the resistance of the resistor 406 will be larger and, consequently, the current in the current branch 403 would be smaller. However, since the current I5 is copied in the current branch 403, the current I5 will compensate the voltage change at the source of the transistor 408.

This means that the voltage at the source of the transistor 408 will not change very much under different temperature conditions, and also the gate-source-voltage Vgs of the transistor 408 will not change very much under different PVT conditions.

The function of the voltage-to-current converter core/transconductance core 422 is to make some temperature compensation. The gate-source voltage Vgs of the transistor 408 can be controlled in a certain range. As a consequence, the control voltage Vctrl will not swing so much. This gives some advantage for the design of the charge pump 304, which may be implemented in an easy way. Through the proposed design, the swing range of the control voltage Vctrl can be limited around ±100 millivolt when the PLL is in normal operation under different PVT conditions.

By choosing the design of the voltage-to-current converter circuit 312 shown in FIG. 4B with the constant transconductivity circuitries 704 and 708, the gain variation of the voltage-controlled oscillator structure 308 will be dominated by the resistor 700 or the resistor 702. Compared to the design in FIG. 4A, the embodiment of the voltage-to-current converter circuit 312 of FIG. 4B can have better noise performance since the total resistor can be designed smaller than that of FIG. 4A. However, the embodiment of the voltage-to-current converter circuit 312 of FIG. 4A exerts higher gain (Kvco) linearity of the voltage-controlled oscillator structure.

Several advantages come with the design concept of the phase-locked loop circuitry 200 comprising the voltage-to-current converter circuit 312 as shown in FIGS. 4A and 4B.

Firstly, the charge pump 304 can be easily designed since the swing range of the control voltage Vctrl is not wide, as explained above. For low voltage and high threshold voltage process, rail-to-rail designs can be avoided, which means that charge pump designs with low power and small layout size can be achieved. Secondly, since the Kvco variation is limited around ±20% to about ±30% under different PVT conditions, the variation of PLL dynamic stability can also be controlled within this range. Thus the low pass filter 306, which has the largest layout size of the PLL, can be implemented without taking up a large layout area, which results in PLL design being achieved without a large layout size.

Thirdly, without any calibration for the VCO center frequency before the PLL starts to work, an additional settling time is avoided. Fourthly, no additional calibration circuitry specifically for PLL calibration is necessary. The only calibration is for the current Ibias provided by the constant current source 418 which can be provided from the chip's trimmable bias current; not only avoiding risks of interference of the sensitive loop performance but fulfilling an efficient trimming mechanism of the chip. Fifthly, if necessary, the source degeneration resistors 406, 414 or the resistors 700, 702 of the constant transconductivity circuitry 704, 708 can be designed with a trim function to achieve more accurate Kvco, further reducing the Kvco variation and low pass filter size. As a consequence, a smaller PLL layout size can be realized without losing the PLL dynamic stability.

Figure 8A:
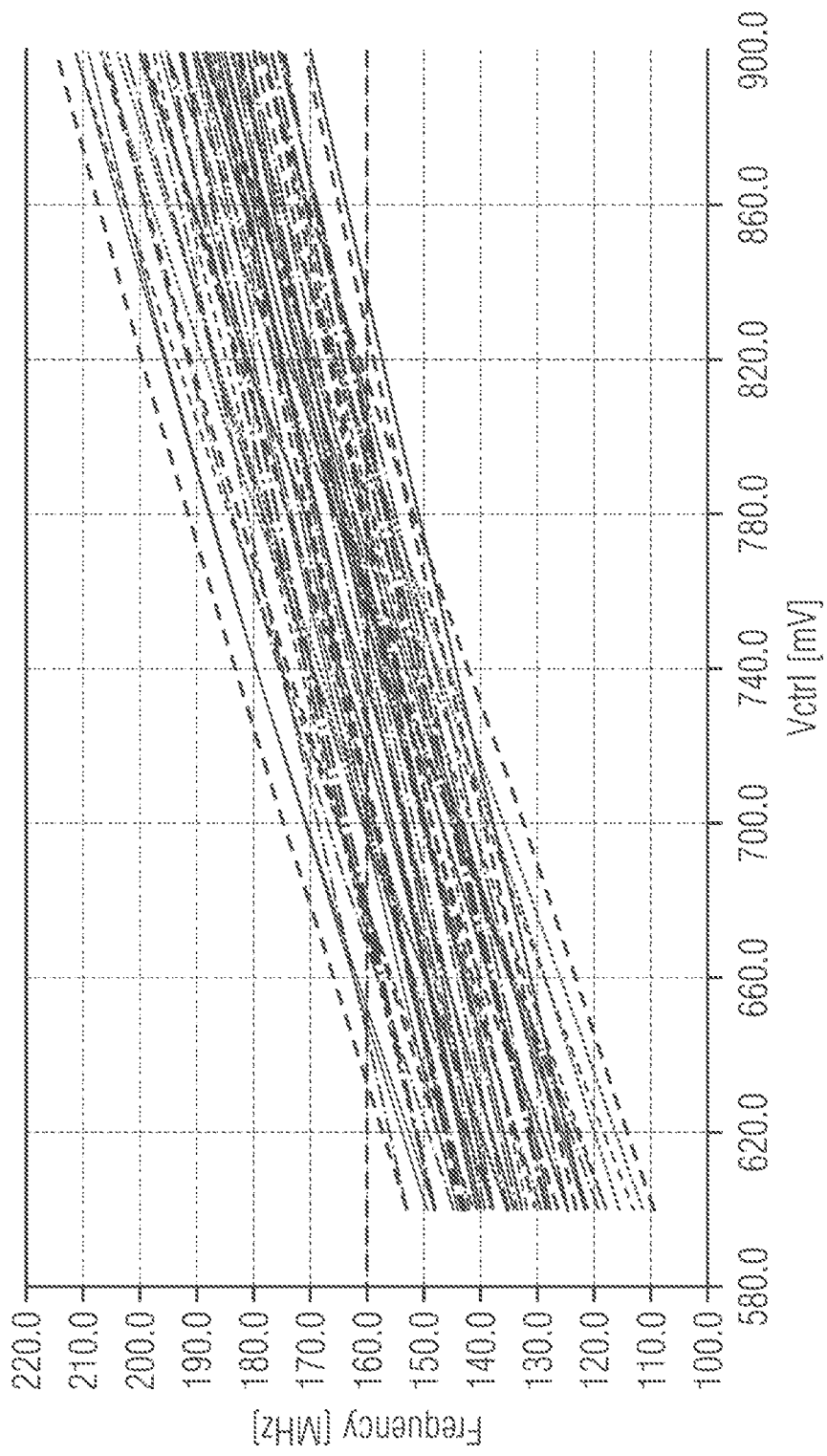

FIGS. 8A and 8B show the characteristic curve of the VCO structure 308 during the PLL normal operation. In this PVT simulation, process variations are verified with FF, SS, SF and SF corners, the supply voltage is verified with 1.2 V with ±5% variation, temperature is verified in the range of −40° C. to +125° C. The PLL is designed at 160 MHz with 200 MHz/V Kvco. It can be observed that the control voltage Vctrl is regulated by the loop from 632 mV to 834 mV under different PVT conditions when the designed PLL output frequency of 160 MHz is reached. The Kvco under all PVT conditions are located within the range of ±30%, a typical value which is from 140 MHz/V to 260 MHz/V.

LIST OF REFERENCE SIGNS

- 100 trimmable phase-locked loop design according to a prior art embodiment
- 200 phase-locked loop circuitry having a low variation transconductance design
- 302 phase/frequency detector
- 304 charge pump
- 306 low pass filter
- 308 voltage-controlled oscillator structure
- 310 feedback divider
- 312 voltage-to-current converter circuit
- 314 current-controlled oscillator circuit
- 400 summing circuit
- 408, 410 source degeneration transistor
- 406, 414 source degeneration resistor
- 409 current mirror loading unit
- 420 voltage divider
- 422 voltage-to-current converter core/transconductance core
- 508 current mirror circuit
- 510 cascade current mirror circuit
- 512 wide swing cascade current mirror circuit
- 600 ring oscillator
- 704, 708 embodiments of constant transconductivity circuitry

The invention claimed is:

1. A phase-locked loop circuitry having low variation transconductance design, comprising:
    a voltage controlled oscillator structure to provide an output signal having an oscillation frequency,
    wherein the voltage controlled oscillator structure comprises a voltage-to-current converter circuit and a current controlled oscillator circuit,
    wherein the voltage-to-current converter circuit generates a control current to control the current controlled oscillator circuit so that the current controlled oscillator structure generates the output signal with the oscillation frequency, the oscillation frequency being dependent from the control current,
    wherein the voltage-to-current converter circuit includes a voltage-to-current converter core having a first current branch and a second current branch, the first current branch comprising a first transistor and the second current branch comprising a second transistor,
    wherein the voltage-to-current converter core includes a current mirror loading unit to mirror a current of the first current branch in the second current branch,
    wherein the first transistor has a gate terminal to apply a reference voltage,
    wherein the voltage controlled oscillator structure has an input terminal to apply a control signal to control the oscillation frequency of the output signal of the voltage controlled oscillator structure,
    wherein the input terminal of the voltage controlled oscillator structure is connected to the gate terminal of the second transistor of the second current branch of the voltage-to-current converter core,
    wherein the control signal applied to the gate terminal of the second transistor is independent from the reference voltage,
    wherein the first current branch comprises a first resistor connected in series with the first transistor between a terminal to provide a supply voltage and a ground potential, and
    wherein the second current branch comprises a second resistor connected in series with the second transistor between the terminal to provide the supply voltage and the ground potential.

2. The phase-locked loop circuitry of claim 1, comprising:
    a supply terminal to supply a supply voltage for the voltage-to-current converter circuit,
    a voltage generator circuit to generate the reference voltage,
    wherein the voltage generator circuit generates the reference voltage in dependence from the supply voltage.

3. The phase-locked loop circuitry of claim 2,
    wherein the voltage generator circuit is configured as a voltage divider.

4. The phase-locked loop circuitry of claim 1,
    wherein the first resistor is configured as a source degeneration resistor for the first transistor,
    wherein the second resistor is configured as a source degeneration resistor for the second transistor.

5. The phase-locked loop circuitry of claim 1,
    wherein the voltage-to-current converter core comprises a third current branch, wherein the first current branch and the second current branch are connected in parallel between a terminal to supply a supply potential and a common node, wherein the third current branch is connected in series to the parallel connection of the first and the second current branch,
    wherein the third current branch comprises a current source biased by a control circuit.

6. The phase-locked loop circuitry of claim 5,
wherein the current source is configured as a third transistor having a gate terminal.
7. The phase-locked loop circuitry of claim 1, comprising:
a bias circuitry comprising a fourth current branch to provide a bias current and a fifth current branch.
8. The phase-locked loop circuitry of claim 7,
wherein the bias circuitry is configured to provide a DC bias current for the current controlled oscillator.
9. The phase-locked loop circuitry of claim 1, comprising:
a summing circuit to sum up a first current and a second current to generate the control current,
wherein the summing circuit comprises a sixth current branch and a current mirror to mirror the sum of the first current and the second current in the sixth current branch to provide the control current in the sixth current branch.
10. The phase-locked loop circuitry of claim 9,
wherein the summing circuit comprises a fourth transistor and a fifth transistor, wherein the fourth and the fifth transistor are arranged in the summing circuit to form the current mirror of the summing circuit,
wherein the fourth transistor is arranged between a terminal to supply a supply voltage and a fifth current branch,
wherein the fifth transistor is arranged in the sixth current branch.
11. The phase-locked loop circuitry of claim 10,
wherein the summing circuit has an internal node being arranged between the fourth transistor and a third transistor,
wherein the internal node of the summing circuit is connected to an internal node of the voltage-to-current converter core between the second transistor and a transistor of the current mirror loading unit.
12. The phase-locked loop circuitry of claim 1,
wherein the current controlled oscillator circuit is configured as a ring oscillator.
13. The phase-locked loop circuitry of claim 1,
wherein the phase-locked loop circuit is configured as a charge-pump phase-locked loop circuit comprising a charge pump being connected to the input terminal of the voltage controlled oscillator structure.
14. A phase-locked loop circuitry having low variation transconductance design, comprising:

a voltage controlled oscillator structure to provide an output signal having an oscillation frequency,
wherein the voltage controlled oscillator structure comprises a voltage-to-current converter circuit and a current controlled oscillator circuit,
wherein the voltage-to-current converter circuit generates a control current to control the current controlled oscillator circuit so that the current controlled oscillator structure generates the output signal with the oscillation frequency, the oscillation frequency being dependent from the control current,
wherein the voltage-to-current converter circuit includes a voltage-to-current converter core having a first current branch and a second current branch, the first current branch comprising a first transistor and the second current branch comprising a second transistor,
wherein the voltage-to-current converter core includes a current mirror loading unit to mirror a current of the first current branch in the second current branch,
wherein the voltage-to-current converter circuit comprises a bias circuitry to provide a bias current,
wherein the first transistor has a gate terminal to apply a reference voltage,
wherein the voltage controlled oscillator structure has an input terminal to apply a control signal to control the oscillation frequency of the output signal of the voltage controlled oscillator structure,
wherein the input terminal of the voltage controlled oscillator structure is connected to the gate terminal of the second transistor of the second current branch of the voltage-to-current converter core,
wherein the control signal applied to the gate terminal of the second transistor is independent from the reference voltage,
wherein the voltage-to-current converter core comprises a third current branch,
wherein the first current branch and the second current branch are connected in parallel between a terminal to provide a supply potential and a common node,
wherein the third current branch is connected in series to the parallel connection of the first and the second current branch, and
wherein the third current branch comprises a current source being different from bias circuitry and biased by a control circuit independent from the bias current.

\* \* \* \* \*